United States Patent [19]

McDougall et al.

[11] Patent Number: 4,701,736
[45] Date of Patent: Oct. 20, 1987

[54] MAGNET ASSEMBLY HAVING A PLURALITY OF NESTED COAXIAL COILS

[75] Inventors: Ian L. McDougall; John M. Bird, both of Oxford, England

[73] Assignee: Oxford Magnet Technology Limited, London, England

[21] Appl. No.: 697,322

[22] Filed: Feb. 1, 1985

[30] Foreign Application Priority Data

Apr. 30, 1984 [GB] United Kingdom ................. 8410972

[51] Int. Cl.⁴ .............................................. H01F 5/00
[52] U.S. Cl. ..................................... 335/299; 335/216
[58] Field of Search ................ 335/216, 299; 324/318, 324/319, 320, 321, 322

[56] References Cited

U.S. PATENT DOCUMENTS

| | | | |
|---|---|---|---|
| 3,256,464 | 6/1966 | Stauffer | 335/299 X |
| 3,283,277 | 11/1966 | Hulm et al. | 335/299 X |
| 3,394,330 | 7/1968 | Schindler | 335/299 X |
| 3,406,333 | 10/1968 | Nelson | 324/320 |
| 4,038,622 | 7/1977 | Purcell | 335/299 X |
| 4,456,881 | 6/1984 | Compton | 324/319 |
| 4,623,864 | 11/1986 | Inoue et al. | 335/299 |

FOREIGN PATENT DOCUMENTS 2156079 10/1985 United Kingdom ................ 324/319

*Primary Examiner*—George Harris
*Attorney, Agent, or Firm*—Kane, Dalsimer, Sullivan, Kurucz, Levy, Eisele and Richard

[57] ABSTRACT

A magnet assembly, particularly for use in NMR imaging apparatus, comprises a plurality of nested, coaxial coils (2-5). The radius and number of turns of the coils (2-5) are such that when working currents flow through the coils substantially uniform magnetic field is generated in a homogeneous region (16).

10 Claims, 8 Drawing Figures

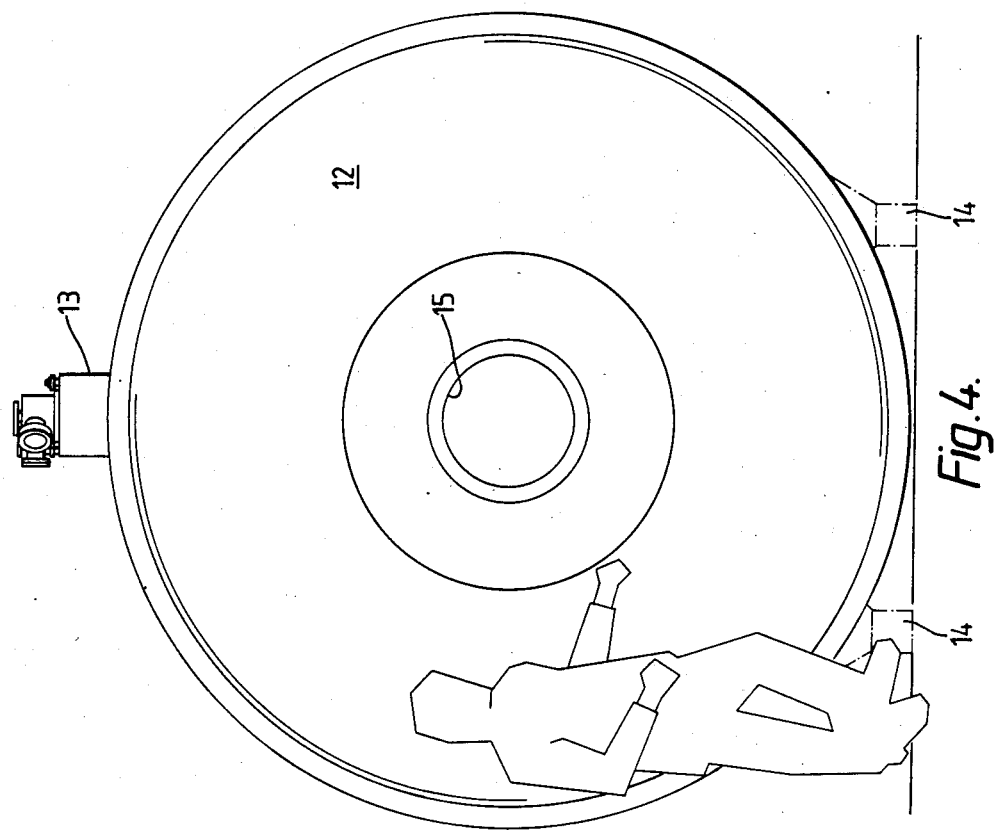
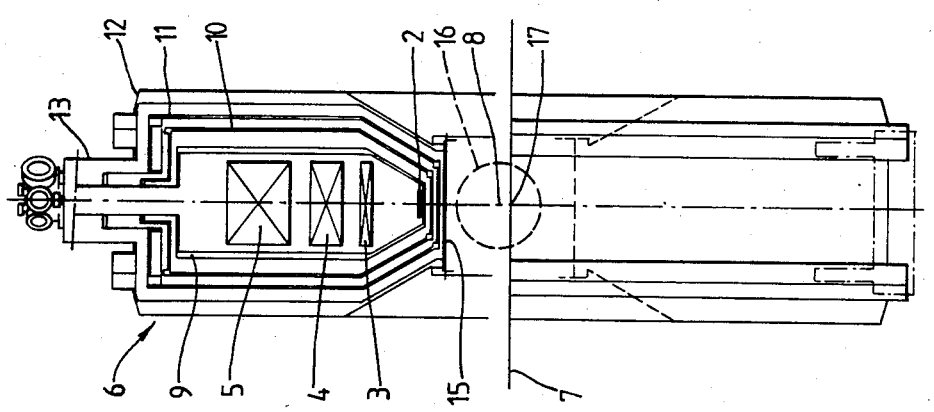

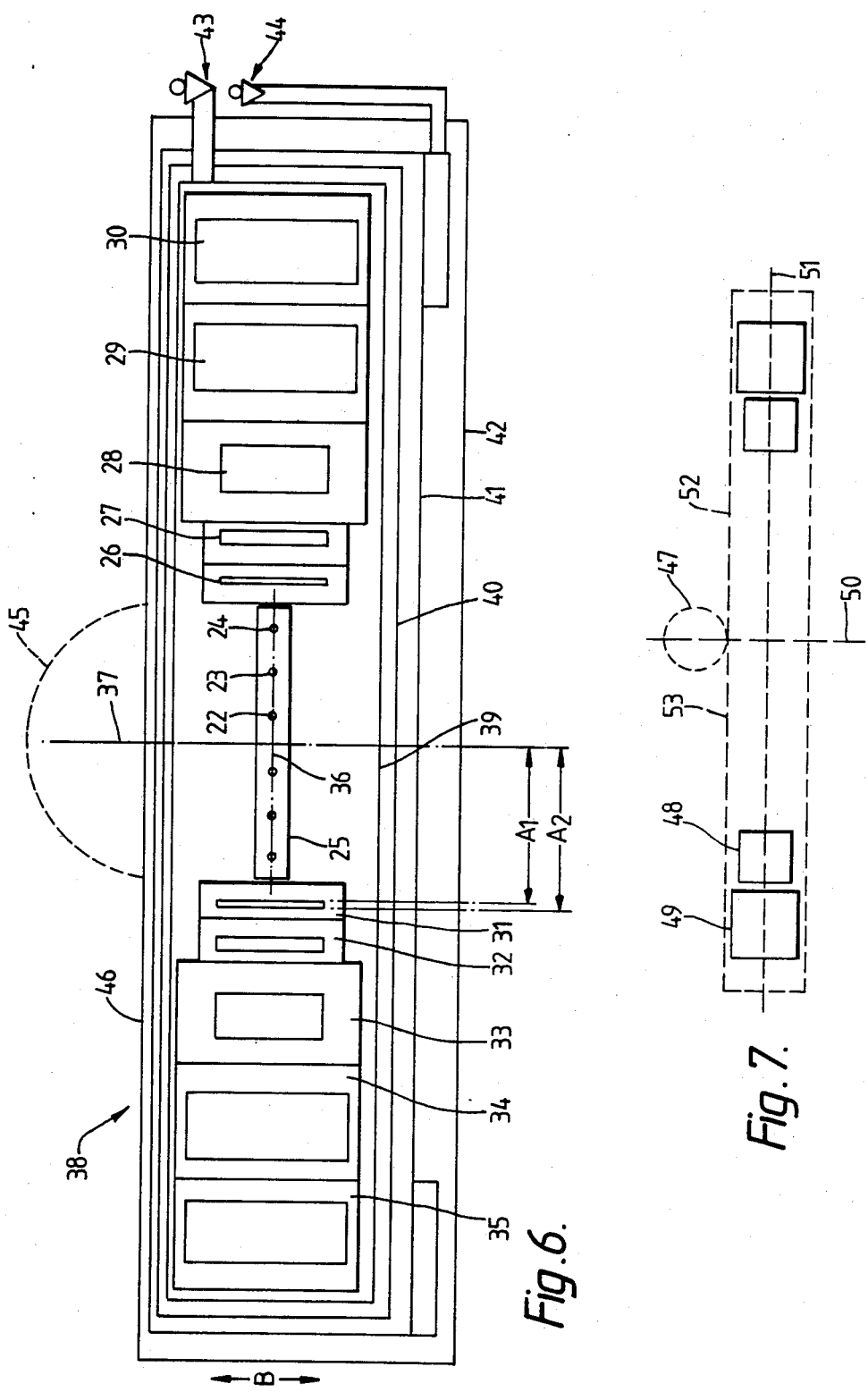

MAGNET ASSEMBLY HAVING A PLURALITY OF NESTED COAXIAL COILS

In the field of nuclear magnetic resonance (NMR) imaging it is necessary to generate a large magnitude magnetic field which is substantially uniform or homogeneous within a defined volume. In other words the rate of change of field strength in the volume is very low, or zero. In the past, this has been achieved by providing a composite solenoid comprising a number of circular coils arranged side by side on a cylinder to simulate the geometry of the solenoid. As will be explained in more detail below, the axial component ($H_z$) of the magnetic field generated by a coil can be expressed in the following form:

$$H_z = H_0 + H_1 + H_2 \ldots H_n$$

where $H_0$ represents the nominal magnitude of the magnetic field while the higher order terms $H_1$-$H_n$ represent error terms. It can be shown that at different axial positions relative to the centre of the coil (that is different values of Z) the signs of the error terms change. Thus in the composite solenoid the coils can be arranged so that at each position along the axis when the same error term (for example $H_2$) is summed for each coil at that position the result will be very close to zero. In this way, a resultant constant and unifore bore magnetic field is generated.

One of the problems with this prior art composite solenoid is its comparatively large size. Typically, it may have a length of about 2.5 meters. Since the fields involved are high requiring large currents it is normally necessary to use superconducting materials which are costly and also require large amounts of cooling apparatus. Furthermore, in the case of NMR imaging a patient will be completely surrounded by the solenoid during the imaging process even where only a small part of the patient's body is to be scanned. We have realised that not only is this undesirable for the patient but it also prevents medical attendents viewing the patient during the scanning process.

In accordance with one aspect of the present invention, a magnet assembly comprises a plurality of nested, coaxial coils, the number of turns of the coils and their radii being such that when working currents flow through the coils a substantially uniform magnetic field is generated in a homogeneous region.

We have found that cancellation of at least some of the error terms ($H_1$-$H_n$) can be obtained with a much more compact magnet assembly than has previously been manufactured. This will be explained in more detail below with reference to the drawings.

The coaxial coils of the invention should be constrasted with the previous use of shim coils. These latter coils are small relatively to the main field coils and generate relatively small correction fields unlike the coils of the invention.

Typically, this new magnet assembly will have an axial length of approximately one quarter that of conventional imaging magnets and yet may be provided with the same bore diameter and capabilities with regard to magnet field strength and purity. In the case of whole body NMR imaging, only a small length of the patient needs to be obscured from view. One important application of the invention will be in the field of NMR head scanning and for this reason it could be incorporated into an NMR scanner dedicated to the scanning of the brain enabling such small scanners to be widely available at relatively lost cost. This will also help to make NMR scanners more acceptable to the patient by reducing encapsulation of the patient.

Clearly, in view of the compact nature of the magnet assembly its cost will be considerably lower than that of a conventional magnet particularly since smaller amounts of superconductor will be required. Furthermore, because the volume of the magnet is much less than conventional imaging magnets the cryostat used to cool the magnet will be much more efficient thermally.

Overall, these advantageous features should lead to a general simplification of the clinical site by virtue of employing a small, lightweight magnet assembly in the scanner.

In some examples, the radially outermost coil has the largest axial length and defines a volume within which the remaining coil or coils are positioned. This leads to a compact construction.

Preferably, at least one pair of coils are positioned symmetrically about a plane normal to the axis of the coils and passing through a mid point of the axis. In this case, the coil array is more simple to physically construct and is electrically more efficient than the nested coils with all coils on the mid plane. The electrical efficiency stems from the coils being able to be more widely separated in space which reduces the number of counter running turns necessary to balance the various error terms. The value of magnetic field within the coils is also reduced by this effect which also makes for more efficient use of conductor (normally superconductor). Alternatively, non-symmetric off axis coils could be used but they will require a larger number of amp turns over symmetric arrangements in order to balance odd error orders.

In general the number of amp turns required from the radially outer coils is greater than from the inner coils and this may be achieved if the number of turns of the coils generally increases in the radially outward direction.

Preferably, the inner and outer radii of each coil are close to the mean radius of the coil. This is particularly advantageous where the currents in adjacent coils flow in opposite directions although this requires the use of a higher current than with conventional superconducting imaging magnets. In fact, if the radius of a current loop is increased the strength of the nth error term due to the current loop drops in proportion to the increase in radius raised to the power n+1. Thus there is a disadvantage in efficiency in attempting to balance error terms from inner coils against those from outer coils if there is a large range of coil radii.

In all the examples discussed the coils will be made from superconductor and thus suitable cooling apparatus will be required. However, the coils could be made from non-superconducting material in some cases.

Conveniently, the coils are connected in series which enables a single power source to be used for supplying the working current (which will be the same for each coil). Alternately more than one power source could be provided if the coils are not connected.

In accordance with a second aspect of the present invention, a method of operating a magnet assembly having a plurality of nested, coaxial coils comprises supplying electrical current to the coils, the flow direction and magnitude of the current in each coil and the number of turns of each coil and their radii being such that a substantially uniform magnetic field is generated in a homogeneous region.

In most cases the magnetic field in the homogeneous region should be as uniform as possible. However, to achieve this requires a large number of coils (for example eight).

We believe that complete uniformity may not be essential even when the magnet assembly forms part of NMR imaging apparatus. Relaxing this constraint by allowing the first order error term to remain uncancelled leads to a significant saving in amp turns for a given field strength. This means that a linear field variation will exist across the homogeneous region. In the process of imaging using standard magnets a linear gradient is applied to the subject in the homogeneous region in order to reference the NMR signal by frequency in space. We consider it is permissible using some imaging techniques to allow this first order gradient to exist. The gradient is pure and can be defined easily at all points in space and does not interfere with signal referencing.

It is particularly convenient if the currents in adjacent coils are caused to flow in opposite directions.

This latter feature leads to a further advantage of the invention. Conventional solenoid magnets have the disadvantage that as their length is reduced as constant diameter the intensity of the magnetic field around the outside of the magnet increases. In principle, a plurality of nested, coaxial coils could also give a substantial fringe field but in the case where currents in adjacent coils are caused to flow in opposite directions this fringe field is virtually eliminated altogether. This again makes the invention particularly applicable to NMR imaging.

As previously mentioned, we have recognised that it is desirable to reduce the encapsulation of the patient and to this end, it is preferable if the homogeneous region projects at least partially from the magnet assembly.

This is a very significant feature of the invention which is particularly applicable when the method is used in connection with magnet assemblies of an NMR imaging apparatus. In fact, if the homogeneous region projects sufficiently from the bore of the magnet assembly, a patient can lie across the end of the magnet assembly and need not be positioned within the bore of the magnet assembly at all. This leads to three important advantages:

(i) by virtue of the patient lying across the Z (or cylindrical) axis of the coils, the component of the magnets field used for imaging is transverse to the patient axis. This permits the use of solenoidal RF transmitter and receiver coils which increases the signal to noise ratio of the NMR signal for a given field and frequency by a factor of about two.

(ii) It is simple (because of the space available) to position the patient on the surface of the magnet assembly to achieve the centre of the homogeneous region at the centre of the region to be imaged. This permits maximum resolution of the tissue being studied in terms of image precision and avoids edge artifacts. It is not possible to achieve this degree of utilisation of the homogeneous volume within the confines of the bore of a cylindrical magnet.

(iii) The amount of superconductor in the flat magnet per amp turn required for a given net field in the homogeneous region is less than for solenoidal coil arrangements. This is because many of the field coils are on a small diameter, since the patient does not pass within the coils. Consequently, the length of conductor per amp turn is smaller than for magnets which partially surround the patient with wire turns and must of necessity be large enough to permit patient access.

An example of a magnet assembly and a method of generating a magnetic field using such a magnetic assembly in accordance with the invention will now be described with reference to the accompanying drawings, in which:

FIG. 2 is a side elevation partly in section of an example of the magnet assembly;

FIG. 4 is an end view of the assembly shown in FIG. 2;

FIG. 6 is a view similar to FIG. 2 but of a third example;

FIG. 7 is a view similar to FIG. 2 but of a fourth example; and,

Figure 1:
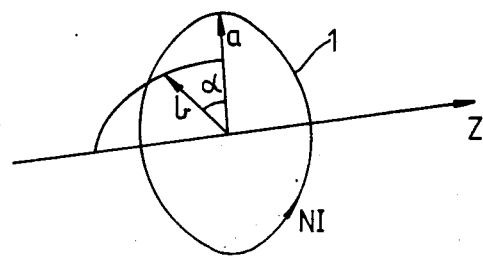
FIG. 1 is a schematic diagram of an electrical coil.

FIG. 1 illustrates diagrammatically a coil 1 having N turns and through which a current I is flowing. The coil has a radius a and defines the Z axis. Current flowing around the coil 1 generates a magnetic field ($H_z(b,\alpha)$) which is a vector quantity lying along the Z direction and which has a magnitude which varies in accordance with b and $\alpha$. It can be shown that the magnetic field can be represented by a power series for variation in two dimensions, as follows:

$$H_z(b,\alpha) = H_0\left(1 + \Sigma\left(\frac{1}{H_0} \times \frac{1}{n!} \times \frac{d^n H_z}{dz^n}(Z,0)\,(b/a)^n P_n(\cos\alpha)\right)\right)$$

where $P_n$ is a Legendre polynomial.

For simplicity, we shall consider the magnetic field along the Z axis itself where $\alpha$ equals 90°. In this case, the Legendre polynomial $P_n$ is unity for all n. This leads to:

$$H_z = (b,90) = H_0 + H_1 + H_2 + \ldots H_n$$

where $$H_0 = KNI \times \frac{a^2}{(a^2 + Z^2)^{3/2}}$$

where K is a constant whose value depends on the units of $H_0$.

$H_0$ is the field value at the origin of a single elemental circular coil. The remaining terms may collectively be called error terms and modify slightly the actual field at each point Z from the expected value $H_0$. Thus:

$$H_1 = 3KNI \times \frac{a^2 bz}{(a^2 + Z^2)^{5/2}}$$

$$H_{n+1} = \frac{2n+1}{n} \frac{bZ}{(a^2 + Z^2)} \times H_n -$$

-continued
$$\frac{(n+1)}{n} \frac{b}{(a^2 + Z^2)} \times H_{n-1}$$

It can be shown that as a given coil moves along the Z axis the sign of any particular error terms changes at the original position of the coil. Thus, in the prior art solenoid, it was possible to a devise composite solenoid in which the coils were arranged so that at least the significant error terms cancelled each other out.

Although this has been shown for 'on-axis' terms, it can also be shown that if cancellation of a given order on the Z axis is exact when comparing order strengths from two or more coils, then the effect of that order is zero at all points off the Z axis. Also if the field value of a given order on the Z axis is finite then there will be an effect of that actual order at points off the Z axis. The value of the off Z axis field will vary with the magnitude of the angle $\alpha$ and is given by the solid harmonic series expanded using Legendre polynomials.

FIG. 2 illustrates an example of a magnet assembly in accordance with the invention which comprises four coils 2-5 mounted in a conventional cryostat 6 about a common axis 7 (corresponding to the Z axis in FIG. 1). In this example, the coils 2-5 are arranged symmetrically about a plane 8 perpendicular to the axis 7. Each coil 2-5 has its turns concentrated in a respective annulus.

The coils 2-5 are fomred of superconducting material and are mounted in a liquid helium vessel 9 which maintains the coils at about 4° K. The liquid helium vessel 9 is mounted within an inner thermal shield 10 which in turn is mounted within an outer, liquid nitrogen cooled thermal shield 11. A vacuum jacket 12 is provided around the outer thermal shield 11. A turret 13 is provided at the top of the assembly containing a heat exchanger to enable gaseous helium to cool the shield 10. The assembly is mounted on legs 14 (FIG. 4).

Figure 3:
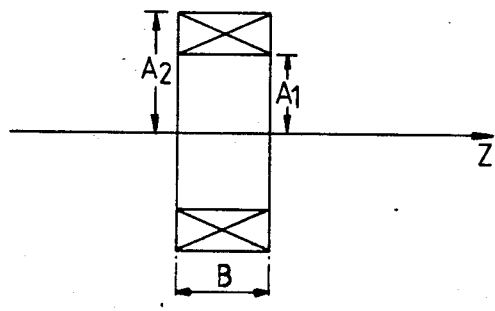
FIG. 3 illustrates the cross-section of a typical coil and the characteristic dimensions of the coil.

Typical dimensions for the coils are set out in Table 1 below. Reference should be made to FIG. 3 for illustration of the dimensions $A_1$, $A_2$, B.

TABLE 1

| Coil Nos. | $A_1$ (cm) | $A_2$ (cm) | Turns per cm$^2$ of cross-section | B (cm) | Turns |
|---|---|---|---|---|---|
| 2 | 34.85 | 35.15 | −5.55 | 7.2 | 12 |
| 3 | 53.10 | 56.90 | 5.55 | 30 | 633 |
| 4 | 64.0 | 75.70 | −5.55 | 30 | 1948 |
| 5 | 108.0 | 132.0 | 5.55 | 30 | 3996 |

The radially inner ends of the cryostat 6 taper towards the axis 7 and define a bore 15 having a length of about 50 cms and a diameter of about 50 cms.

With this configuration a bore magnetic field of 1T is achieved with a current of 959 Amps flowing through each coil. The '−' sign for coils 2 and 4 indicates current flows in the opposite direction to that in coils 3, 5. The bore field is uniform within a homogeneous region 16 of spherical shape centred on the geometric centre 17 of the magnet assembly.

When this magnet assembly is located in an NMR imager a patient will be positioned within the bore 5 which has dimensions sufficient to receive a patient while still providing a sufficiently strong and uniform magnetic field within the bore to enable imaging to be achieved.

It will now be described how to determine the number of turns, radii, current magnitude, and current flow direction for each coil 2-5 in order to obtain a uniform magnetic field within the homogeneous region 16. The number of turns and current magnitude can conveniently be expressed in terms of amp turns $N_2$, $N_3$, $N_4$, $N_5$. The magnet assembly can then be designed with compensation up to a given order by solving the following simultaneous equations (using matrix condensation):

TABLE 2

| | COILS | | | | |
|---|---|---|---|---|---|
| ORDERS | 2 | 3 | 4 | 5 | SUM |
| 0 | $H_0(N_2)$ | $H_0(N_3)$ | $H_0(N_4)$ | $H_0(N_5)$ | $S_0$ = Working Field |
| 1 | $H_1(N_2)$ | $H_1(N_3)$ | $H_1(N_4)$ | $H_1(N_5)$ | $S_1 = 0$ |
| 2 | $H_2(N_2)$ | $H_2(N_3)$ | $H_2(N_4)$ | $H_2(N_5)$ | $S_2 = 0$ |
| 3 | $H_3(N_2)$ | $H_3(N_3)$ | $H_3(N_4)$ | $H_3(N_5)$ | $S_3 = 0$ |

Examination of the equations given previously will show that $H_n$ does not change sign very frequently with radius and thus in order to achieve a sign change it is simplest to change the sign of the amp turn quantity. In other words, current is caused to flow through the coils 2-5 in alternate directions. For example, current may flow into the paper in coils 2 and 4 and out of the paper in coils 3 and 5.

We believe that it is possible to achieve error cancellation by this method at least up to and including twelfth order error terms.

Once the amp turn quantities have been determined the actual choice of current and number of turns depends on engineering constraints. The principal factors are as follows:

(a) Calculate a coil layout using elemental arcs and an arbitrary number of amp turns to get to the approximate bore field and necessary cancellation of error terms.

(b) Arbitrary choice of operating current needs to be made based on experience in handling current through supply leads, switches, joints and typically available capacity from superconductor designs. The current value should, in general, be as high as possible to minimise the overall coil dimensions.

(c) Given a particular operating current an exact definition of the superconductor is made using estimated values of magnetic field in the coil winding. It should be remembered that superconductors are specified in regard to performance in terms of the current value they will carry at a series of applied magnetic fields.

(d) The overall dimensions of the coils are calculated by expanding their dimensions about the original position of the elemental arcs on each coil. The overall dimension of each coil may be adjusted to achieve again the necessary cancellation of error terms. At this stage the exact value of magnetic field within all the coil windings is calculated.

(e) Calculation of the stress within the superconductor is made using the product of current field and turn radius; these calculations are refined to get the integral stress values at any point in the winding due to the local forces and the forces due to adjacent turns.

(f) Because it is unlikely that at a first iteration the calculated stresses will be acceptable, steps (c) through (e) inclusive are repeated until a safe operating stress level is achieved. Variable parameters in this iteration are current and conductor size, the other coil dimensions change in response to running current and exact number of turns. The design criteria in regard to stress are almost wholly derived from practical experience and therefore implicity relate to manufacturing techniques and design choice of materials.

Figure 5:
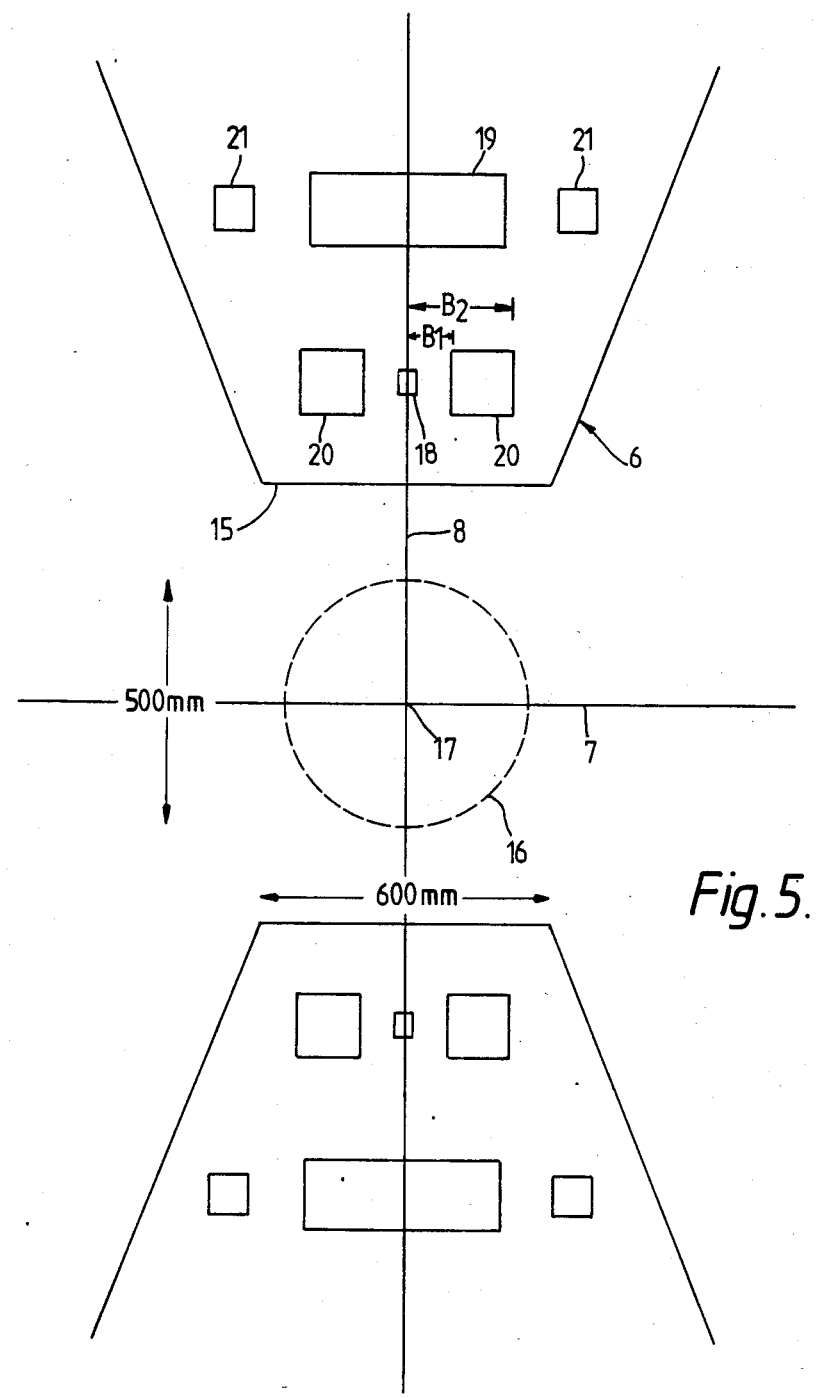
FIG. 5 is a view similar to FIG. 2 but of a second example.

A second example of a magnet assembly is illustrated in FIG. 5. This is similar in all respects to the example shown in FIG. 2 except for the arrangement of coils and so details of the cryostat have been omitted for clarity. Unlike in the FIG. 2 example in which all the coils 2-5 lie about the same plane of symmetry 8, the example shown in FIG. 5 includes coils offset from the plane of symmetry.

The example shown in FIG. 5 comprises two nested, coaxial, coils 18, 19 positioned about the axis 7. In addition, two pairs of coils 20, 21 are positioned axially offset from the coils 18, 19 respectively. The pairs of coils 20, 21 are symmetrically placed about the mid plane 8 of the magnet assembly.

This example is more simple to construct physically since the coils 18, 20 and 19, 21 can be positioned about conventional formers and the arrangement is electrically more efficient than the previous example. This stems from the coils being able to be more widely separately in space.

Table 3 below illustrates the dimensions and number of turns for the coils 18-21 in a magnet assembly for producing a magnetic field of 1.0T in the homogeneous region 16.

TABLE 3

| Coil | Turns | $A_1$ (cm) | $A_2$ (cm) | $B_1$ (cm) | $B_2$ (cm) | TD per cm$^2$ |
|---|---|---|---|---|---|---|
| 19 | 3108 | 93.00 | 107.00 | −20.00 | 20.00 | 5.55 |
| 21 | 320 | 96.20 | 103.80 | −33.80 | −26.20 | 5.55 |
| 21 | 320 | 96.20 | 103.80 | 26.20 | 33.80 | 5.55 |
| 18 | 97 | 62.90 | 67.10 | −2.10 | 2.10 | 5.55 |
| 20 | 772 | 59.10 | 70.90 | −9.10 | −20.90 | −5.55 |
| 20 | 772 | 59.10 | 70.90 | 9.10 | 20.90 | −5.55 |

The dimensions $B_1$ $B_2$ are illustrated for one of the coils 20 in FIG. 5. The '−' sign against some turn densities indicates that current flow to these coils is in the opposite direction to current flow through the other coils.

If a current of 1,000 amps is passed through all the coils, a uniform field of 1.0T is generated within the homogeneous zone 16, the peak to peak field error being 20 ppm.

It should be noted by comparing Tables 1 and 3 that the total number of turns required is much less in the FIG. 5 example. The FIG. 5 example also has the advantage that the homogeneous zone 16 is easily accessible to a patient thus reducing encapsulation of the patient as in the FIG. 2 example.

The examples described so far produce a homogeneous region which is centred on the geometric centre 17 of the magnet assembly and is thus within the bore of the magnet assembly. Despite the short length of the bore in these cases, there is, nevertheless, some encapsulation of the patient when the magnet assembly is used in NMR imaging apparatus.

FIG. 6 illustrates a magnet assembly in which the homogeneous region partially projects from the bore. The magnet assembly illustrated in FIG. 6 comprises three coaxial, nested coils 22, 23, 24 mounted on an iron former 25. In addition, five further nested coils 26-30 mounted in respective iron formers 31-35 are mounted coaxially with the coils 22-24. Each of the coils 22-24, 26-30 is positioned symmetrically about a mid plane 36 of the magnet assembly, the mid plane 36 being perpendicular to the axis 37 of the coils.

As in the previous examples, the coils are formed from superconducting material and are mounted in a cryostat 38. The cryostat 38 comprises a helium can 39 within which the coils are positioned; and inner radiation shield 40; an outer radiation shield 41; and a vacuum case 42. Communication with the helium cam 36 is achieved via an outlet and valve 43 while liquid nitrogen for cooling the outer radiation shield 41 is supplied via a valve and inlet connection 44.

The magnet assembly shown in FIG. 6 can be arranged so that a substantially uniform magnetic field is generated in a homogeneous region 45 which projects beyond the vacuum case 42 of the cryostat 38. Table 4 illustrates the form of the coils needed to achieve this.

TABLE 4

| Coil | $A_1$ (cm) | $A_2$ (cm) | B (cm) | Turns | TD per cm$^2$ |
|---|---|---|---|---|---|
| 22 | 4.800 | 5.200 | 0.38 | 15 | −100 |
| 23 | 12.600 | 13.400 | 0.8 | 64 | 100 |
| 24 | 20.300 | 21.700 | 1.6 | 224 | −100 |
| 26 | 28.600 | 29.400 | 20 | 1600 | 100 |
| 27 | 35.500 | 38.600 | 20 | 6179 | −100 |
| 28 | 46.000 | 54.000 | 20 | 16011 | 100 |
| 29 | 63.900 | 76.100 | 30 | 36573 | −100 |
| 30 | 84.600 | 95.400 | 30 | 32415 | 100 |

With a current of 386 amps through each coil, this configuration provides a magnetic field within the homogeneous region 45 having a peak to peak homogeneity of 100 ppm with a value of 1.0 Tesla for $H_0$.

It should be noted that the current direction in each alternate coil in the radial direction alternates. This is necessary since a coil must be provided for each error term to be corrected as odd order gradients do not cancel by symmetry as in a magnet assembly comprising pairs of coils distributed evenly on each side of the mid plane. This magnet assembly is, therefore, less efficient in terms of the number of amp turns for a given central field than an assembly of the long solenoid type but it has a number of important advantages.

In particular, when the magnet assembly is used in NMR imaging apparatus, a surface 46 of the cryostat 38 can be laid horizontally and the patient then laid on this surface. In this way, no encapsulation of the patient is necesary and the patient axis is now in the radial direction of the coils (not the axial direction). Other advantages of this have been mentioned earlier.

A further important cryogenic advantage is also achieved. The arrangement shown in FIG. 6 provides a flat cryostat 38 whose surface area is about half that of a standard cryostat for a solenoidal magnet. Typically, this would reduce the radiation components of the cryostat head load to about 78 mW from 155 mW, thereby saving cryogen consumption. Approximately 0.1 liters of helium per hour is saved.

Another example of a magnet assembly with a projected homogeneous region is illustrated in FIG. 7. In the previous example, seven coils were needed to balance all error terms up to seventh order and consequently a large number of amp turns were also required.

In the example shown in FIG. 7, a homogeneous spherical region 47 is generated with a radius of about 5 cm which should be compared with the 25 cm radius of the homogeneous region 45 of the FIG. 6 example. The purpose of this reduction is to minimise the effect of high order error terms. For example, if $H_n$ is the field intensity expressed as due to the nth error term on 25 cm radius, then the intensity on a 5 cm radius is given by:

$H_n(50/250)^n$ thus high order errors do not affect small homogeneous regions.

It will be seen in FIG. 7 that the magnet assembly comprises two coils 48, 49 positioned coaxially about an axis 50 and symmetrically about a mid plane 51 of the magnet assembly. A cryostat 52 is indicated schematically while the formers about which the coils 48, 49 are wound have been omitted.

A first important feature of this magnet assembly is that significant savings in amp turns for a given field have been achieved by allowing the first order error term in the magnetic field to remain uncancelled. This means that a linear field variations will exist across homogeneous region 47. As mentioned previously, we consider that this will not be detrimental when the magnet assembly is used in NMR imaging apparatus.

A second important feature of the magnet assembly is that only two coils 48, 49 are required. As a result the magnetic field value within the coils is proportionately less relative to a given bore field than for the tightly nested coils in the FIG. 6 example. This assists in minimising the amount of superconductor required for a given field in the homogeneous region by virtue of the fact that critical current varies with applied field.

A third important advantage of this arrangement arises from the small number of amp turns and consequential low field intensity within the coils 48, 49. It is possible by changing the current ratio in the coils to move the magnetic centre of the homogenous region 47. Since the coils 48, 49 are nested concentrically about the common axis 50, the homogeneous region may be projected either further away from or closer to the flat surface 54 of the magnet assembly. Thus in NMR imaging apparatus, the patient may be moved in any direction in the plane of the magnet surface.

An example of a coil configuration providing a 1.0T field within the homogeneous region 47 is set out in Table 5 below for a current of 75 amps.

TABLE 5

| Coil | $A_1$ (cm) | $A_2$ (cm) | B (cm) | Turns |
|------|------|------|------|------|
| 48 | 35.1 | 44.5 | 9.5 | −8877 |
| 49 | 45.3 | 58.5 | 13.2 | 17335 |

In this example, the peak to peak field variation is about 10% across the homogeneous region 47.

Figure 8:
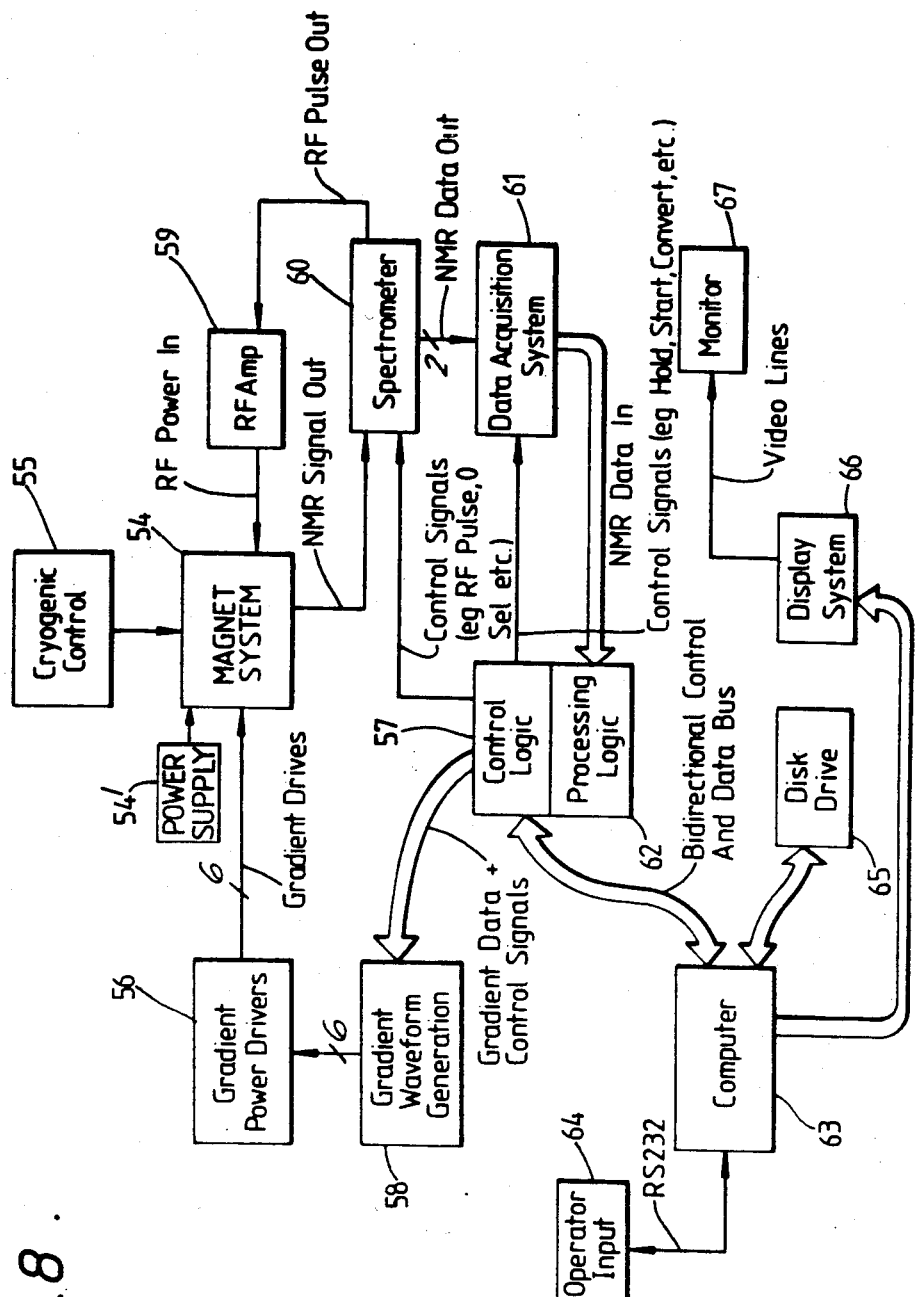
FIG. 8 is a block diagram of imaging apparatus.

One of the most important applications for the magnet assemblies just described is in NMR imaging apparatus. FIG. 8 illustrates in block diagram form such apparatus which is otherwise of a conventional form. The apparatus comprises a magnet system 54 including one of the magnet assemblies previously described and incorporating a power supply 54'. The cryostat is connected to a conventional cryogenic control system 55.

A number of gradient coils (not shown) are mounted on a former around the homogeneous region generated by the magnet assembly so that different gradients of magnetic field can be set up through the homogeneous region to enable NMR imaging experiments to be carried out. These gradient coils are not superconducting coils and are also of a conventional form. They are driven by respective power drivers 56 controlled by control logic 57 via a waveform generator 58. Coils (not shown) for generating and receiving RF energy are mounted on the same former as the gradient coils, the RF transmitter being connected to an amplifier 59 which is connected to a spectrometer 60. The generation of RF pulses is controlled by the control logic 57 which is connected to the spectrometer 60. NMR data from the spectrometer 60 passes to a data acquisition system 61 which is controlled by the control logic 57. Data from the system 61 then passes to processing logic 62.

The overall control of the NMR apparatus is provided by a computer 63 which is connected via a conventional RS 232 interface to an operator input station 64. Information for the computer 63 is stored in a disc drive 65 while the results of the imaging experiments are passed by the computer 63 to a display system 66 which can display "slices" through the patient's body on a monitor 67.

In use, a patient is positioned so that his body intersects part of the homogeneous region generated by the magnet assembly and this may either require positioning the patient within a bore of the magnet assembly, as in the FIG. 2 example, or lying the patient on a flat surface as in the FIGS. 6 and 7 examples.

We claim:

1. A magnet assembly comprising a plurality of nested, coaxial coils each having a plurality of turns defining radii, whereby working currents are adapted to flow in opposite directions through at least two of said coils, said plurality of turns of said coils and said radii being adapted such that when working currents flow through said coils a substantially uniform magnetic field is generated in a homogeneous region.

2. An assembly according to claim 1, wherein a radially outermost coil defines a volume within each another coil is positioned.

3. An assembly according to claim 1, wherein the number of turns of said coils generally increases in the radially outward direction.

4. An assembly according to claim 1, said assembly defining a plane normal to said axis of said coils and passing through a mid point of said axis wherein at least one pair of said coils are positioned symmetrically about said plane.

5. An assembly according to claim 1, wherein each coil defines respective inner and outer radii and a mean radius, said inner and outer radii of each coil being close to said means radius of said coil.

6. NMR imaging apparatus including a magnet assembly according to claim 1.

7. A method of operating a magnet assembly comprising a plurality of nested, coaxial coils each having a plurality of turns defining radii, the method comprising supplying electrical currents to said coils, said electrical currents flowing in opposite directions through at least two of said coils whereby the magnitude of said current in each said coil and the number of said turns and their radii is adapted such that a substantially uniform magnetic field is generated in a homogeneous region.

8. A method according to claim 7, wherein the direction of flow of said current is opposite in adjacent, radially spaced coils.

9. A method according to claim 7, wherein said homogeneous region projects at least partially from said magnet assembly.

10. A method according to claim 8, wherein said homogeneous region projects at least partially from said magnet assembly.

* * * * *